United States Patent
Shao et al.

(10) Patent No.: US 12,310,005 B2
(45) Date of Patent: May 20, 2025

(54) SEMICONDUCTOR STRUCTURE AND MANUFACTURING METHOD THEREOF

(71) Applicant: CHANGXIN MEMORY TECHNOLOGIES, INC., Hefei (CN)

(72) Inventors: Guangsu Shao, Hefei (CN); Deyuan Xiao, Hefei (CN); Yunsong Qiu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 443 days.

(21) Appl. No.: 17/807,895

(22) Filed: Jun. 21, 2022

(65) Prior Publication Data
US 2023/0320079 A1     Oct. 5, 2023

Related U.S. Application Data

(63) Continuation of application No. PCT/CN2022/091800, filed on May 9, 2022.

(30) Foreign Application Priority Data

Mar. 31, 2022   (CN) ......................... 202210329106.0

(51) Int. Cl.
H10B 12/00     (2023.01)
(52) U.S. Cl.
CPC ........... H10B 12/482 (2023.02); H10B 12/05 (2023.02)
(58) Field of Classification Search
CPC ........ B60S 1/3862; B60S 1/524; H10B 12/05; H10B 12/315; H10B 12/482; H10B 12/488
See application file for complete search history.

(56) References Cited

U.S. PATENT DOCUMENTS

| 2009/0004797 A1 | 1/2009 | Lee |
| 2013/0234230 A1 | 9/2013 | Takesako et al. |

(Continued)

FOREIGN PATENT DOCUMENTS

| CN | 101335244 A | * 12/2008 | ....... H01L 27/10876 |
| CN | 101789433 A |   7/2010 | |

(Continued)

OTHER PUBLICATIONS

International Search Report cited in PCT/CN2022/091800 mailed Oct. 26, 2022, 8 pages.

*Primary Examiner* — Edward Chin
(74) *Attorney, Agent, or Firm* — Kilpatrick Townsend & Stockton LLP

(57) ABSTRACT

The present disclosure provides a semiconductor structure and a manufacturing method thereof, relates to the technical field of semiconductors. The manufacturing method includes: forming a plurality of first trenches arranged at intervals and extending along a first direction in a base; forming a first insulating layer on a sidewall of the first trench, where a thickness of the first insulating layer is smaller than a target value, and the first insulating layer defines a second trench; performing a silicification reaction on a substrate exposed in the second trench; forming a second insulating layer on a sidewall of the second trench, where the second insulating layer defines a third trench, and a sum of thicknesses of the first insulating layer and the second insulating layer is equal to the target value; and forming an isolation layer in the third trench.

20 Claims, 16 Drawing Sheets

(56) References Cited

U.S. PATENT DOCUMENTS

| | | | |
|---|---|---|---|
| 2013/0320433 A1 | 12/2013 | Cho et al. | |
| 2014/0061778 A1 | 3/2014 | Myung et al. | |
| 2014/0342516 A1* | 11/2014 | Dongping | H10B 12/053 438/243 |
| 2015/0340368 A1* | 11/2015 | Oshima | H10B 12/033 438/430 |
| 2016/0284710 A1* | 9/2016 | Kim | H10B 12/03 |
| 2018/0053770 A1 | 2/2018 | Kim et al. | |
| 2023/0121734 A1* | 4/2023 | Yu | H10B 12/0335 257/296 |
| 2023/0170416 A1 | 6/2023 | Xiao et al. | |
| 2024/0008246 A1* | 1/2024 | Jiang | H10B 12/05 |

FOREIGN PATENT DOCUMENTS

| | | |
|---|---|---|
| CN | 114141712 A | 3/2022 |
| JP | 2014045064 A | 3/2014 |
| KR | 101986145 B1 * | 6/2019 |

\* cited by examiner

SEMICONDUCTOR STRUCTURE AND MANUFACTURING METHOD THEREOF

CROSS-REFERENCE TO RELATED APPLICATIONS

The present disclosure is a continuation application of International Patent Application No. PCT/CN2022/091800, filed on May 9, 2022, which claims the priority to Chinese Patent Application 202210329106.0, titled "SEMICONDUCTOR STRUCTURE AND MANUFACTURING METHOD THEREOF" and filed with the China National Intellectual Property Administration (CNIPA) on Mar. 31, 2022. The entire contents of International Patent Application No. PCT/CN2022/091800 and Chinese Patent Application 202210329106.0 are incorporated herein by reference.

TECHNICAL FIELD

The present disclosure relates to the technical field of semiconductors, and in particular to a semiconductor structure and a manufacturing method thereof.

BACKGROUND

With the development of semiconductor technologies, the semiconductor structure is used increasingly widely. The semiconductor memory, especially a dynamic random access memory (DRAM) is widely used in various electronic devices due to its high storage density, fast reading and writing speed.

The DRAM usually includes a plurality of memory cells. Each memory cell includes a transistor and a capacitor. A gate of the transistor is electrically connected to a word line (WL) of the DRAM. The on and off of the transistor is controlled by the voltage on the WL. One of a source and a drain of the transistor is electrically connected to a bit line (BL), and the other is electrically connected to the capacitor. Data information is stored or outputted by the BL.

To improve the storage density of the memory, the transistor in the DRAM is a vertical transistor of a gate-all-around (GAA) structure, and the BLs in the DRAM are usually buried. However, the semiconductor structure has a low yield.

SUMMARY

According to some embodiments, a first aspect of the present disclosure provides a manufacturing method of a semiconductor structure, including:
  forming a plurality of first trenches arranged at intervals and extending along a first direction in a base;
  forming a first insulating layer on a sidewall of the first trench, where a thickness of the first insulating layer is smaller than a target value, and the first insulating layer located in the first trench defines a second trench;
  performing a silicification reaction on a substrate exposed in the second trench;
  forming a second insulating layer on a sidewall of the second trench, where the second insulating layer located in the second trench defines a third trench, and a sum of thicknesses of the first insulating layer and the second insulating layer is equal to the target value; and
  forming an isolation layer in the third trench, where the isolation layer fills up the third trench.

According to some embodiments, a second aspect of the present disclosure provides a semiconductor structure. The semiconductor structure is formed by the foregoing manufacturing method, and therefore has at least the advantage that the semiconductor structure has a high yield.

DETAILED DESCRIPTION

The inventor through research found the reason that the semiconductor structure has a relatively low yield in the related art is that in the process of manufacturing the semiconductor structure, when formed on a sidewall of a first trench of the substrate, a first insulating layer is usually deposited first on the sidewall and a bottom of the first is trench, and then the first insulating layer at the bottom of the first trench is removed through etching. However, the first insulating layer is relatively thick, and a space of a region defined by it is relatively small. In addition, the contour of the first insulating layer formed through deposition is incompletely perpendicular. As a result, it is usually difficult to remove the first insulating layer located at the bottom of the first trench, which causes the first insulating layer to still cover the substrate located at the bottom of the first trench, and it is difficult to silicify this part of the substrate. Consequently, it is difficult to make buried BLs, and the semiconductor structure has a relatively low yield.

In the manufacturing method of a semiconductor structure provided by embodiments of the present disclosure, a first insulating layer and a second insulating layer are sequentially formed on a sidewall of a first trench. After the first insulating layer is formed, the substrate exposed in a region defined by the first insulating layer is silicified. Compared with that the silicification reaction is performed after the second insulating layer is formed, a larger part of the substrate is exposed through the silicification reaction performed after the first insulating layer is formed, such that the silicified substrate can be integrated along a second direction, thereby improving the performance of the semiconductor structure. WLs are formed subsequently in a region where the first insulating layer and the second insulating layer are located. A sum of thicknesses of the first insulating layer and the second insulating layer is equal to the target value, to have a sufficient space for manufacturing the WLs, and further improve the performance of the semiconductor structure.

To make the objectives, features and advantages of the embodiments of the present disclosure clearer, the technical solutions in the embodiments of the present disclosure are described clearly and completely below with reference to the drawings in the embodiments of the present disclosure. Apparently, the described embodiments are merely some rather than all of the embodiments of the present disclosure. All other embodiments obtained by those of ordinary skill in the art based on the embodiments of the disclosure without creative efforts shall fall within the protection scope of the present disclosure.

Figure 1:
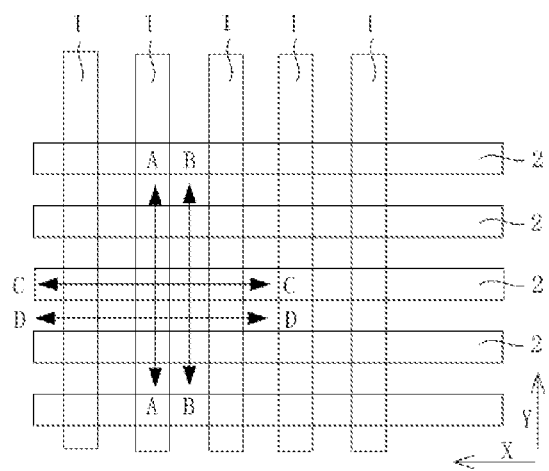
FIG. 1 is a top view of a WL and a BL in a semiconductor structure according to an embodiment of the present disclosure.

FIG. 1 is a top view of a semiconductor structure according to an embodiment of the is present disclosure. The semiconductor structure includes WLs 2 and BLs 1. The WLs 2 extend along a first direction, while the BLs 1 extend along a second direction. The first direction and the second direction form an angle. For example, the second direction may be perpendicular to the first direction. Specifically, as shown in FIG. 1, the BLs 1 extend along a vertical direction (a direction Y in FIG. 1), while the WLs 2 extend along a horizontal direction (a direction X in FIG. 1).

FIG. 1 shows four different positions at A, B, C and D. A cross section taken along A-A is parallel to an extension direction of the BLs 1 and located on the BLs 1. A cross section taken along B-B is parallel to the extension direction of the BLs 1 and located between adjacent BLs 1. A cross section taken along C-C is parallel to an extension direction of the WLs 2 and located on the WLs 2. A cross section taken along D-D is parallel to the extension direction of the WLs 2 and located between adjacent WLs 2.

Figure 2:
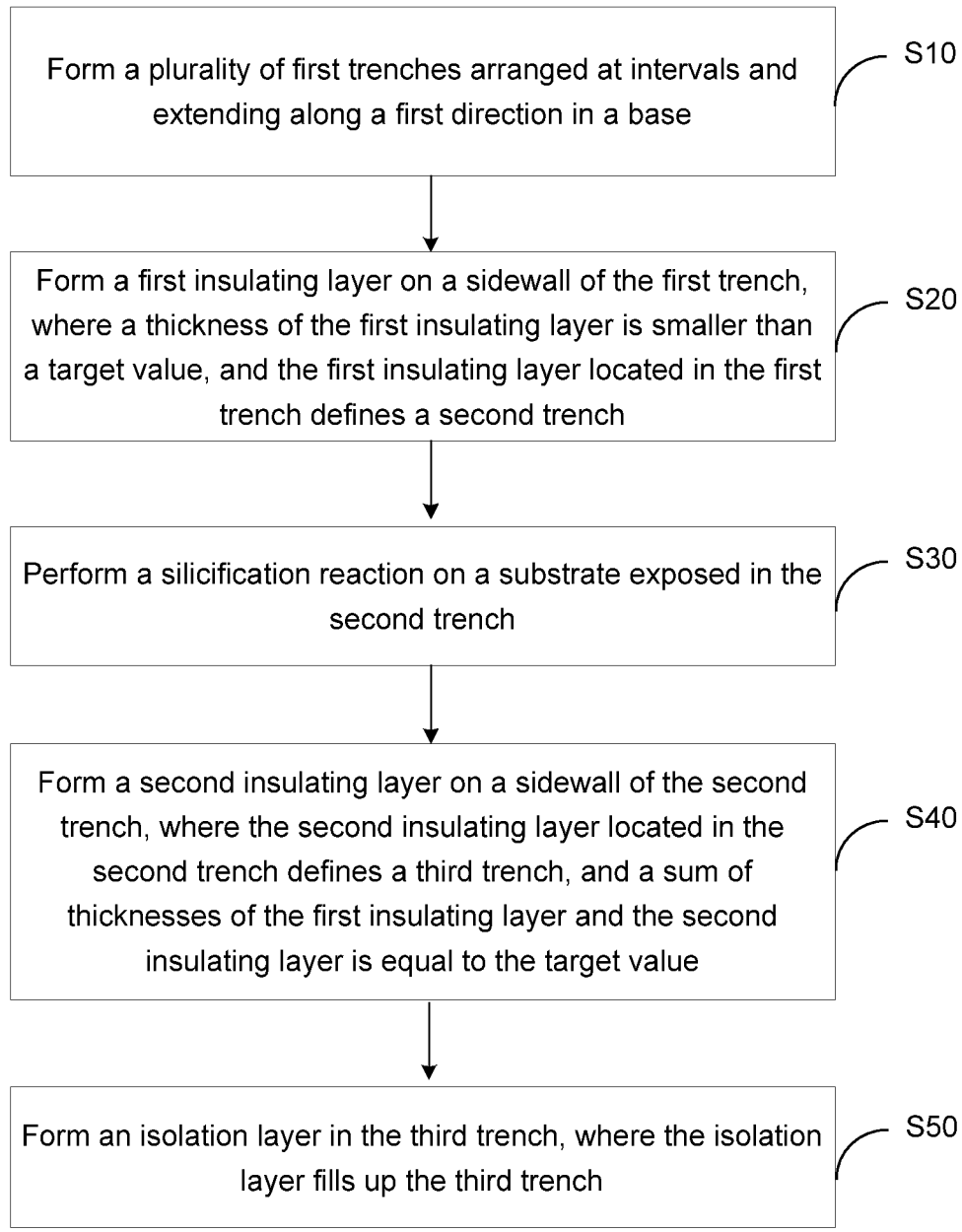
FIG. 2 is a flowchart of a manufacturing method of a semiconductor structure according to an embodiment of the present disclosure.
Figure 3:
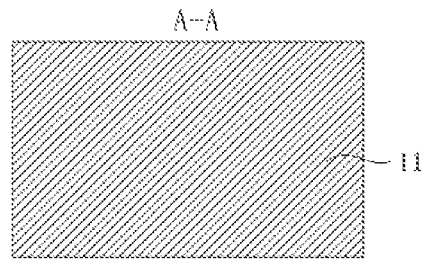
FIGS. 3 to 6 are schematic diagrams of cross sections of a substrate respectively taken along A-A, B-B, C-C, and D-D according to an embodiment of the present disclosure.
Figure 4:
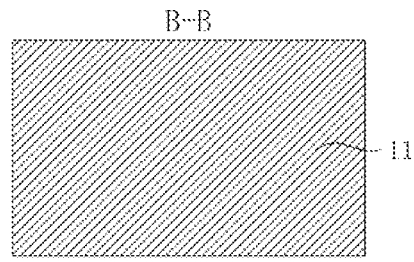
Figure 5:
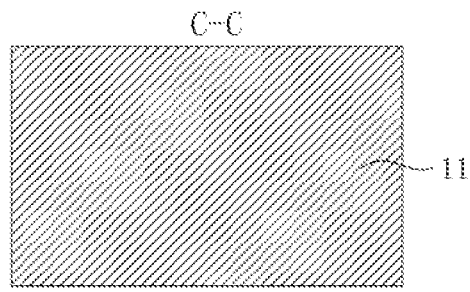
Figure 6:
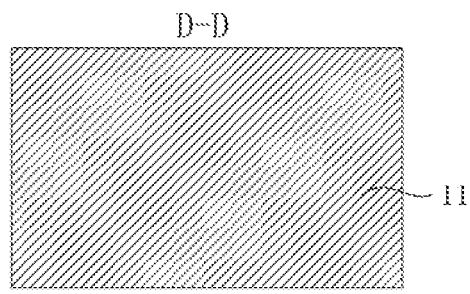
Figure 7:
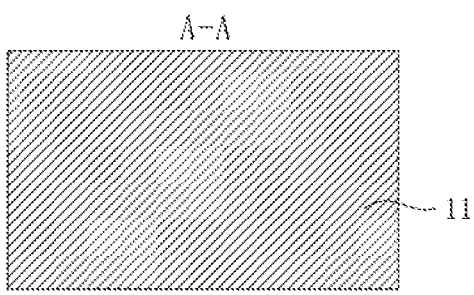
FIGS. 7 to 10 are schematic diagrams of cross sections respectively taken along A-A, B-B, C-C, and D-D after a fourth trench is formed according to an embodiment of the present disclosure.
Figure 8:
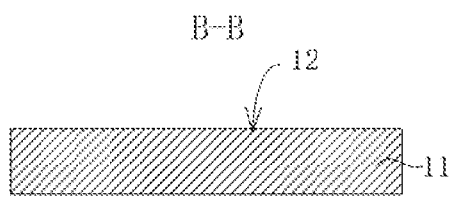
Figure 9:
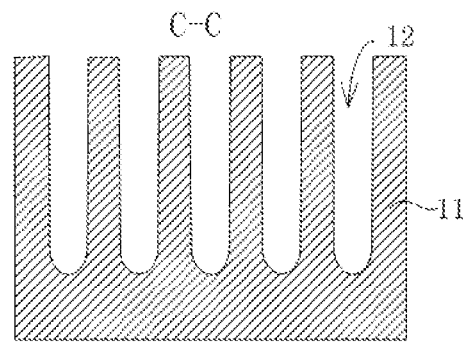
Figure 10:
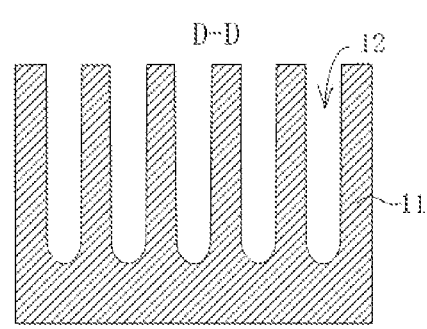
Figure 11:
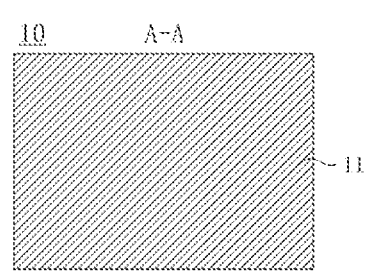
FIGS. 11 to 14 are schematic diagrams of cross sections of a base respectively taken along A-A, B-B, C-C, and D-D according to an embodiment of the present disclosure.
Figure 12:
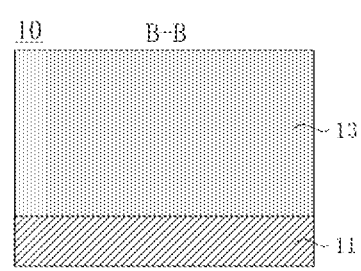
Figure 13:
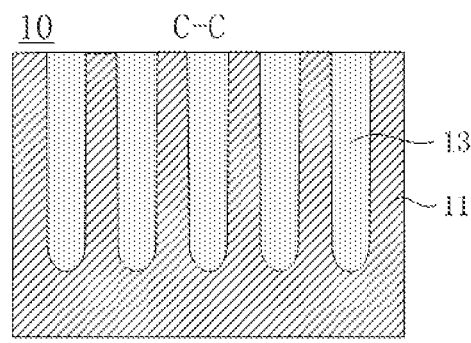
Figure 14:
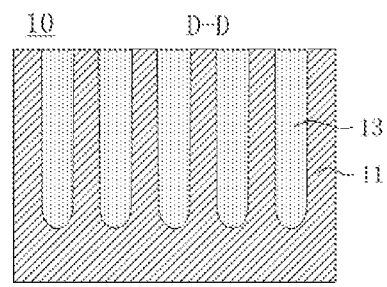
Figure 15:
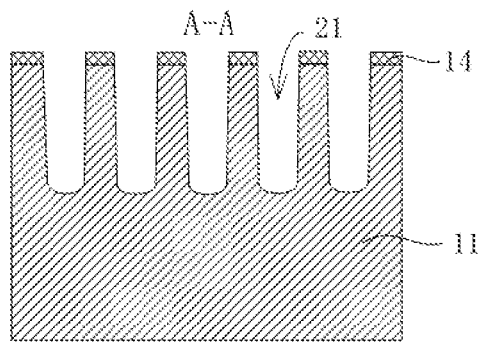
FIGS. 15 to 18 are schematic diagrams of cross sections respectively taken along A-A, B-B, C-C, and D-D after a first trench is formed according to an embodiment of the present disclosure.
Figure 16:
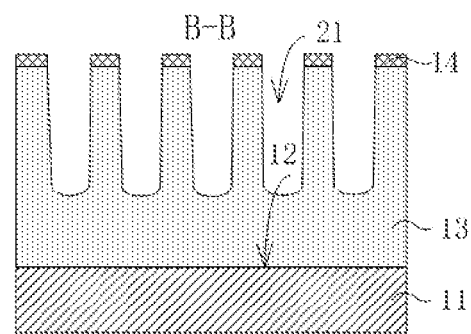
Figure 17:
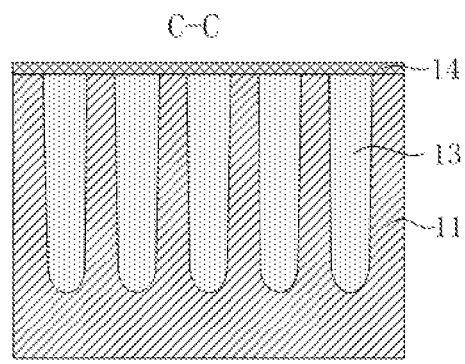
Figure 18:
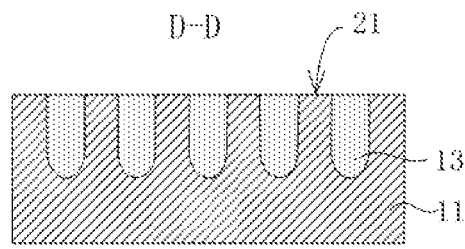
Figure 19:
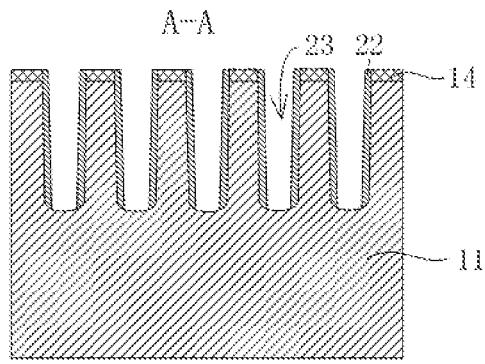
FIGS. 19 to 22 are schematic diagrams of cross sections respectively taken along A-A, B-B, C-C, and D-D after a first insulating layer is formed according to an embodiment of the present disclosure.
Figure 20:
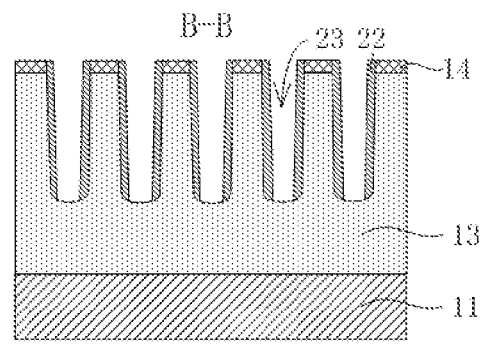
Figure 21:
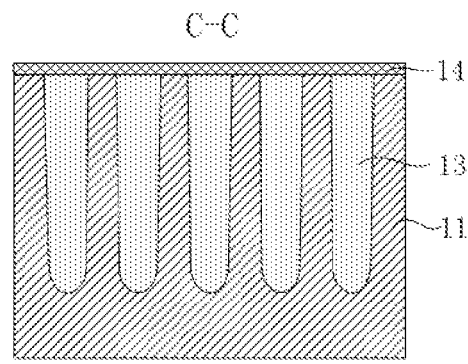
Figure 22:
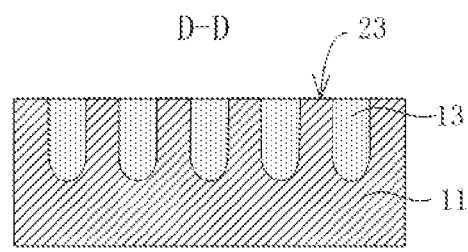
Figure 23:
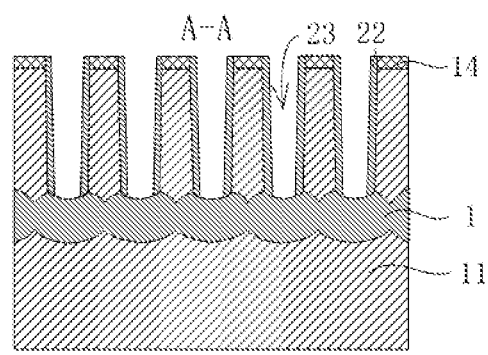
FIGS. 23 to 26 are schematic diagrams of cross sections respectively taken along A-A, B-B, C-C, and D-D after the BL is formed according to an embodiment of the present disclosure.
Figure 24:
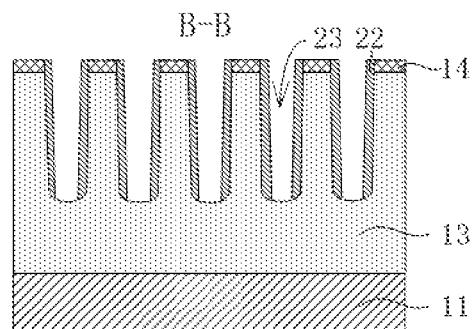
Figure 25:
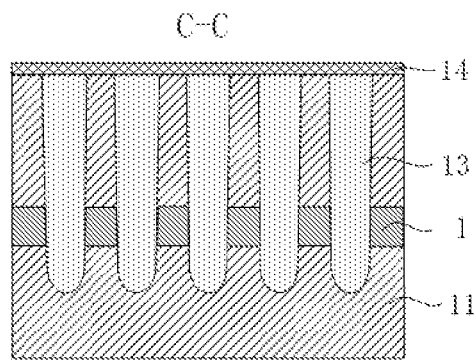
Figure 26:
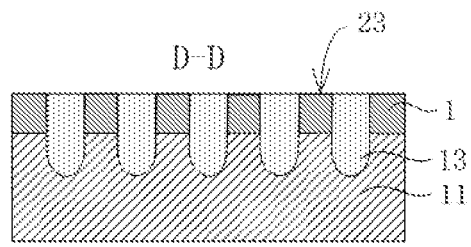
Figure 27:
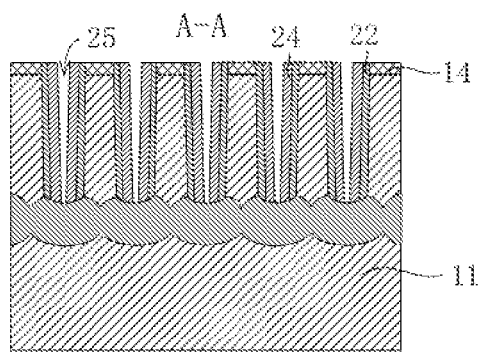
FIGS. 27 to 30 are schematic diagrams of cross sections respectively taken along A-A, B-B, C-C, and D-D after a second insulating layer is formed according to an embodiment of the present disclosure.
Figure 28:
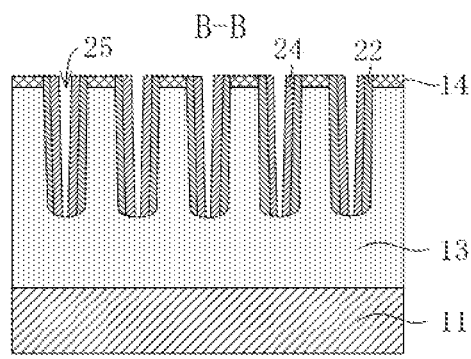
Figure 29:
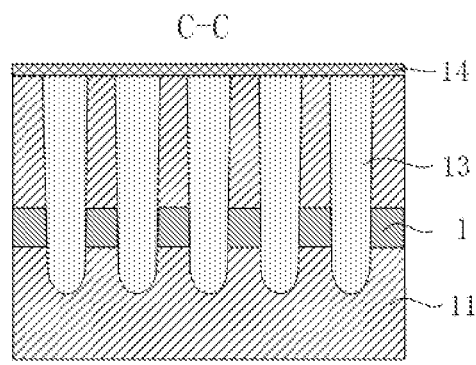
Figure 30:
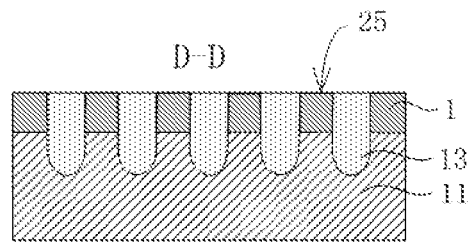
Figure 31:
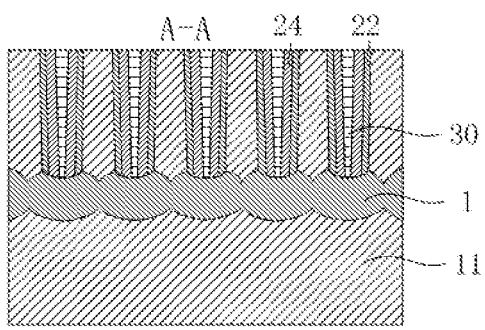
FIGS. 31 to 34 are schematic diagrams of cross sections respectively taken along A-A, B-B, C-C, and D-D after an isolation layer is formed according to an embodiment of the present disclosure.
Figure 32:
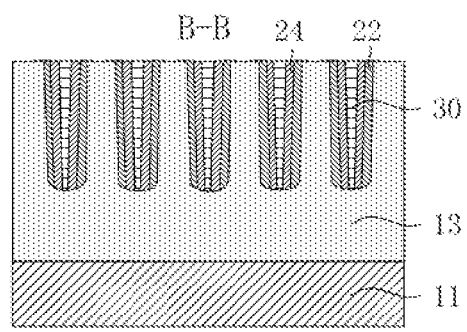
Figure 33:
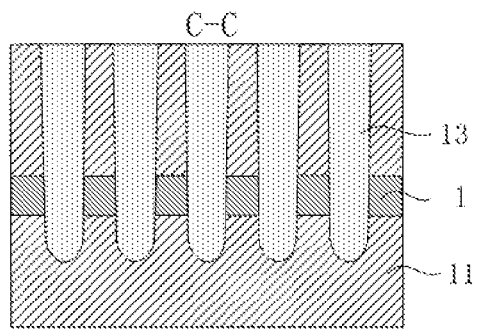
Figure 34:
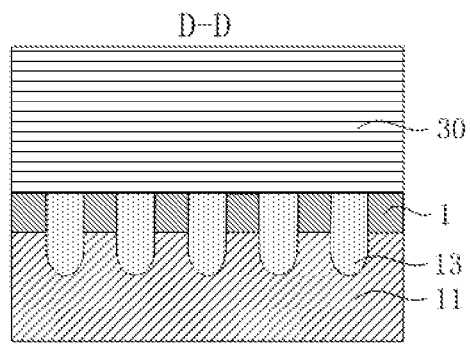
Figure 35:
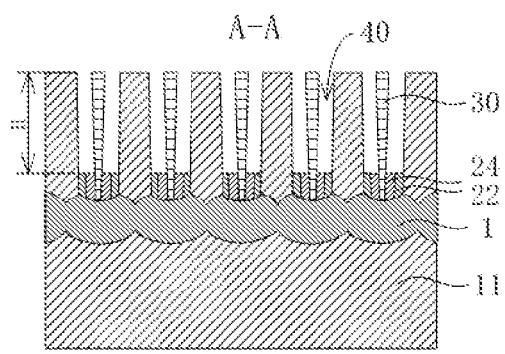
FIGS. 35 to 38 are schematic diagrams of cross sections respectively taken along A-A, B-B, C-C, and D-D after a filling space is formed according to an embodiment of the present disclosure.
Figure 36:
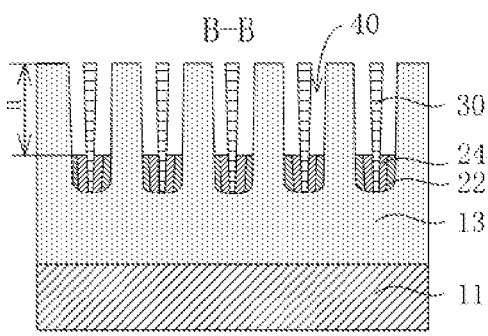
Figure 37:
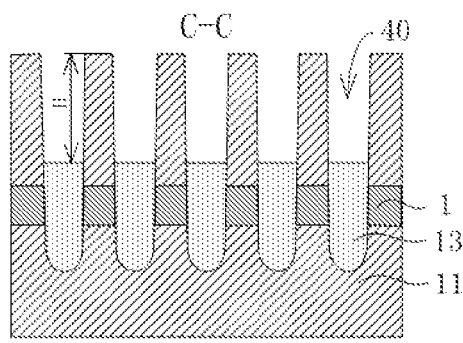
Figure 38:
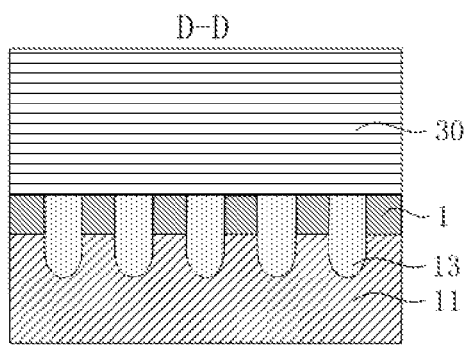
Figure 39:
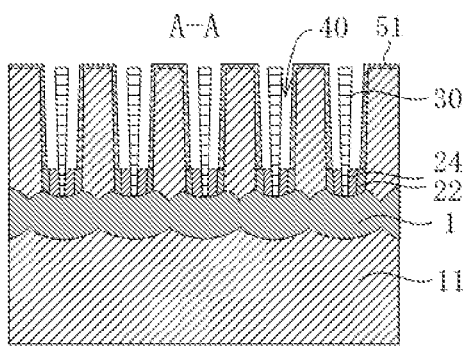
FIGS. 39 to 42 are schematic diagrams of cross sections respectively taken along A-A, B-B, C-C, and D-D after an initial dielectric layer is formed according to an embodiment of the present disclosure.
Figure 40:
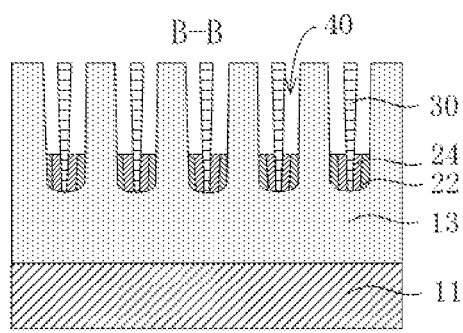
Figure 41:
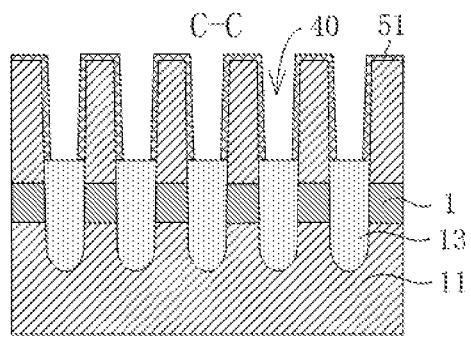
Figure 42:
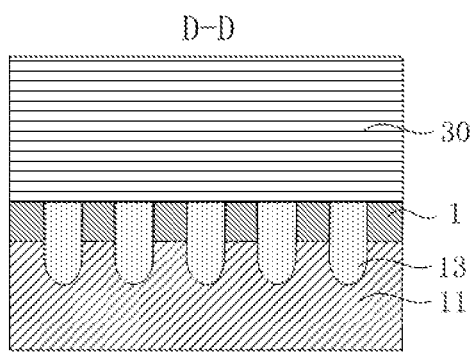
Figure 43:
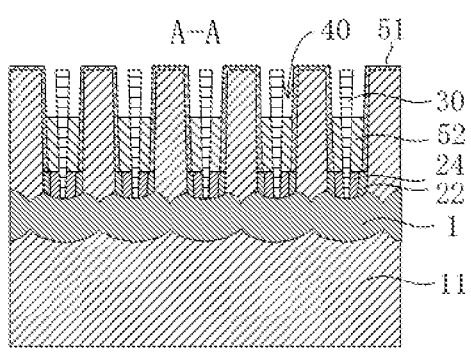
FIGS. 43 to 46 are schematic diagrams of cross sections respectively taken along A-A, B-B, C-C, and D-D after a conductive layer is formed according to an embodiment of the present disclosure.
Figure 44:
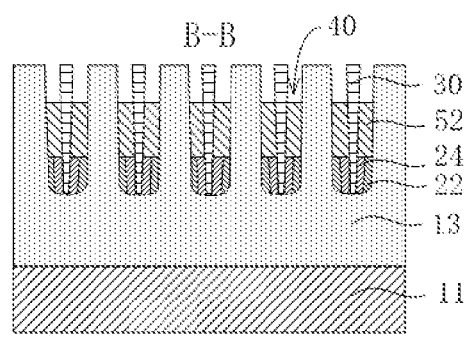
Figure 45:
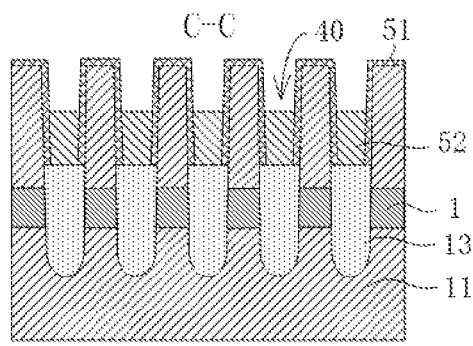
Figure 46:
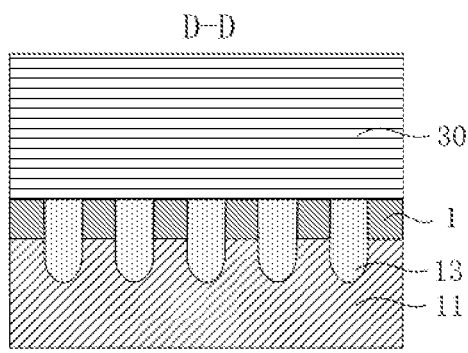

FIG. 2 is a flowchart of a manufacturing method of a semiconductor structure according to an embodiment of the present disclosure. The manufacturing method includes the following steps:

Step S10: Form a plurality of first trenches arranged at intervals and extending along a first direction in a base.

With reference to FIGS. 3 to 10, in some possible embodiments, before the plurality of first trenches 21 arranged at intervals and extending along a first direction are formed in a base 10 (step S10), the method further includes: providing the base 10, where the base 10 includes the substrate 11 and a third insulating layer 13, the substrate 11 is provided with a plurality of fourth trenches 12 arranged at intervals and extending along a second direction, and the third insulating layer 13 fills the fourth trench 12. Specifically, the providing the base 10, where the base 10 includes the substrate 11 and a third insulating layer 13, the substrate 11 is provided with a plurality of fourth trenches 12 arranged at intervals and extending along a second direction, and the third insulating layer 13 fills the fourth trench 12 may include the following step:

providing the substrate 11; and etching the substrate 11, to form the plurality of fourth trenches 12 in the substrate 11, where the fourth trench 12 is deeper than the first trench 21. As shown in FIGS. 3 to 10, a part of the substrate 11 is removed to form the plurality of fourth trenches 12 in the substrate 11. The plurality of fourth trenches 12 are arranged at intervals, extend along the second direction, and are configured to isolate the BLs 1. For example, the plurality of fourth trenches 12 are formed through a self-aligned double patterning (SADP) process or a self-aligned quadruple patterning (SAQP) process to increase the density of the fourth trenches 12 and guarantee the aspect ratio of the fourth trenches 12.

With reference to FIGS. 15 to 18, the depth of the fourth trench 12 is greater than that of the first trench 21. The fourth trench 12 and the first trench 21 may have a same width. The depth refers to a distance between the trench bottom and the top surface of the substrate 11. The width refers to a distance between two sidewalls that are opposite to each other, that is, the bottom of the fourth trench 12 may be located below that of the first trench 21. The plurality of fourth trenches 12 communicate with the plurality of first trenches 21, to separate a part of the substrate 11 into a plurality of columnar structures.

A third insulating layer 13 is deposited in each of the fourth trenches 12. The third insulating layer 13 fills the fourth trench 12. As shown in FIGS. 7 to 14, the top surface of the third insulating layer 13 is flush with that of the substrate 11, to fill up the third trench 25.

With reference to FIGS. 11 to 14, the base 10 includes the substrate 11 and the third insulating layer 13. The plurality of fourth trenches 12 arranged at intervals and extending along the second direction are formed in the substrate 11. The third insulating layer 13 fills the fourth trench 12. The substrate 11 may be a semiconductor substrate such as a silicon substrate, a germanium substrate, a silicon carbide (SiC) substrate, a silicon-germanium (SiGe) substrate, a germanium-on-insulator (GOI) substrate, or a silicon-on-insulator (SOI) substrate. As shown in FIGS. 11 to 14, the third insulating layer 13 fills up the fourth trench 12. The top surface of the third insulating layer 13 is flush with that of the substrate 11, such that top surfaces of the third insulating layer 13 and the substrate 11 form a flat surface, which is beneficial to forming another structure thereon. The third insulating layer 13 may be made of an oxide, such as silicon oxide.

In some possible examples, with reference to FIGS. 15 to 18, the base 10 further includes a protective layer 14. The protective layer 14 covers the substrate 11 and the is third insulating layer 13. Through such a disposal, it can be avoided that the substrate 11 is exposed, thereby preventing the top surface of the substrate 11 from being contaminated during the subsequent silicification reaction, and ensuring its performance. Preferably, the protective layer 14 and the third insulating layer 13 may be made of a same material. Through such a disposal, the protective layer 14 and the third insulating layer 13 can be formed at the same time, to simplify the manufacturing process of the semiconductor structure. Specifically, the third insulating material is deposited in the fourth trench 12 and on the substrate 11. The third insulating material fills up the fourth trench 12 and covers the substrate 11. The third insulating material on the substrate 11 is partially removed through a flattening process. The surface of the remaining third insulating material away from the substrate 11 is flat. In this case, the third insulating material in the fourth trench 12 forms the third insulating layer 13. The third insulating material on the substrate 11 forms the protective layer 14. Certainly, the formation of the protective layer 14 is not limited, and may be performed in another manner. For example, after the third insulating layer 13 is formed, the protective layer 14 is deposited on the substrate 11 and the third insulating layer 13.

The deposition may be a chemical vapor deposition (CVD), a physical vapor deposition (PVD), an atomic layer deposition (ALD), and the like. The foregoing flattening process may be chemical mechanical polishing.

The first trench 21 is formed in the base 10. It extends along a first direction, that is, the first trench 21 and the WL 2 extend in a same direction. With reference to FIGS. 15 to 18, the first trench 21 is shallower than the fourth trench 12, that is, a bottom of the first trench 21 is partially located in the substrate 11, and is further partially located in the third insulating layer 13. Through such a disposal, the fourth trenches 12 extend along the second direction, and separate the upper part of the substrate 11 into a plurality of strip structures. The first trenches 21 extend along the first direction and separate the upper part of each of the strip structures into a plurality of columnar structures, to form active pillars arranged in an array. The active pillar is configured to form a source, drain, and channel region of a transistor, and the source, drain, and, channel region are arranged perpendicularly. The lower part of each of the remaining strip structures subsequently is forms the BL 1, to be electrically connected to one of the source and drain in the transistor. The third insulating layer 13 fills a space between adjacent strip structures, which can ensure that adjacent BLs 1 are insulated from each other.

Step S20: Form a first insulating layer on a sidewall of the first trench, where a thickness of the first insulating layer is smaller than a target value, and the first insulating layer located in the first trench defines a second trench.

With reference to FIGS. 15 to 22, the first insulating layer 22 covers the sidewall of the first trench 21, to prevent the sidewall of the first trench 21 from being silicified. The first insulating layer 22 may be made of an oxide, such as silicon oxide. The thickness of the first insulating layer 22 is smaller than the target value, and the target value may be 5 to 20 nm. For example, the thickness of the first insulating layer 22 may be 1 to 2 nm. The first insulating layer 22 is relatively thin, and occupies a smaller space in the first trench 21, such that a relatively large part of the substrate 11 is exposed in the second trench 23 defined by the first insulating layer 22. In other words, the second trench 23 defined by the first insulating layer 22 exposes a relatively large part of the substrate 11 therein. Such a disposal is beneficial to manufacturing the first insulating layer 22, and silicifying the substrate 11 at the bottom of the second trench 23.

In some possible implementations, with reference to FIGS. 15 to 22, the forming of the first insulating layer 22 on the sidewall of the first trench 21, where the thickness of the first insulating layer 22 is smaller than the target value, and the first insulating layer 22 located in the first trench 21 defines the second trench 23 includes:

depositing an initial first insulating layer on the sidewall and a bottom wall of the first trench 21, and the base 10. The initial first insulating layer covers the sidewall and a bottom wall of the first trench 21, and the base 10. In an embodiment in which the base includes the protective layer 14, the initial first insulating layer covers the protective layer 14.

After the deposition, the initial first insulating layer is etched, and the initial first insulating layer on a sidewall of the first trench 21 is retained. The retained initial first insulating layer forms the first insulating layer 22. That is, after the deposition, the initial first insulating layer is etched back. The initial first insulating layer on a bottom wall of the first trench 21 and the base 10 is removed. The initial first insulating layer on the sidewall of the first trench 21 is retained, to form the first insulating layer 22.

The thickness of the initial first insulating layer may be 1 to 2 nm. After it forms the first insulating layer, the thickness of the first insulating layer 22 is 1 to 2 nm. Through such a disposal, when the initial first insulating layer is etched back, a space for etching the initial first insulating layer on the bottom wall of the first trench 21 is relatively large, which can ensure that this part of the initial first insulating layer can be removed, to expose the substrate 11, and the substrate 11 can be subsequently processed. In addition, the initial first insulating layer is relatively thin, and therefore the initial first insulating layer on the bottom wall of the first trench 21 is easy to remove. The first trench 21 may be etched deeper, that is, the aspect ratio of the first trench 21 is increased, to heighten the substrate 11 between adjacent first trenches 21. Subsequently, when this part of the substrate 11 forms a source region, drain region, and a channel region, ends of the source region/drain region are heightened, thereby reducing band-to-band tunneling (BTBT) and gate-induced drain leakage (GIDL).

Step S30: Perform a silicification reaction on a substrate exposed in the second trench.

With reference to FIGS. 23 to 26, the silicification reaction is performed on the substrate 11 exposed in the second trench 23. A metal silicide is formed in the substrate 11, and the metal silicide is connected along the second direction to form the BL 1. The metal silicide may be titanium silicide, tantalum silicide, cobalt silicide, nickel silicide, tungsten silicide, or the like. Specifically, a metal layer is deposited in the second trench 23, and then is annealed, to make the metal in the metal layer react with the substrate 11 (for example, silicon) to form the metal silicide. Thereafter, the excessive metal layer is removed.

Step S40: Form a second insulating layer on a sidewall of the second trench, where the second insulating layer located in the second trench defines a third trench, and a sum of thicknesses of the first insulating layer and the second insulating layer is equal to the target value.

Figure 47:
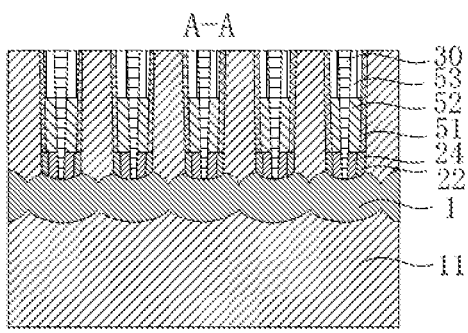
FIGS. 47 to 50 are schematic diagrams of cross sections respectively taken along A-A, B-B, C-C, and D-D after a fourth insulating layer is formed according to an embodiment of the present disclosure.
Figure 48:
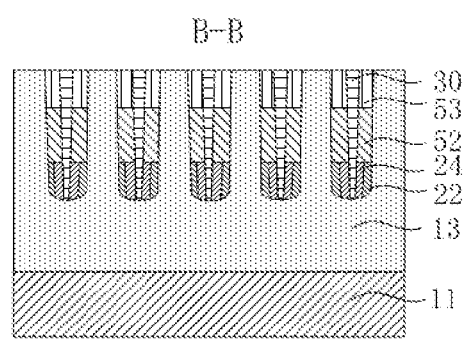
Figure 49:
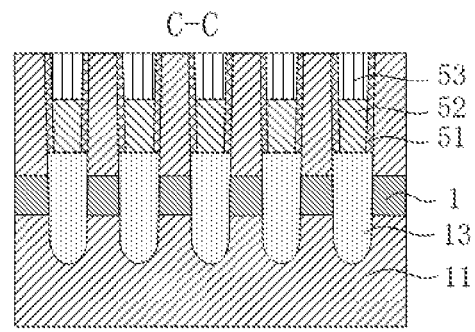
Figure 50:
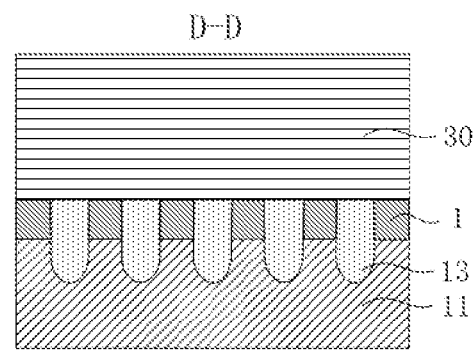
Figure 51:
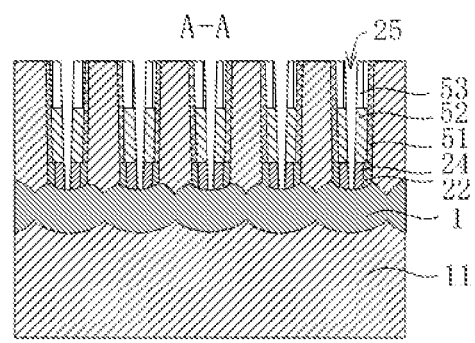
FIGS. 51 to 54 are schematic diagrams of cross sections respectively taken along A-A, B-B, C-C, and D-D after the isolation layer is removed according to an embodiment of the present disclosure.
Figure 52:
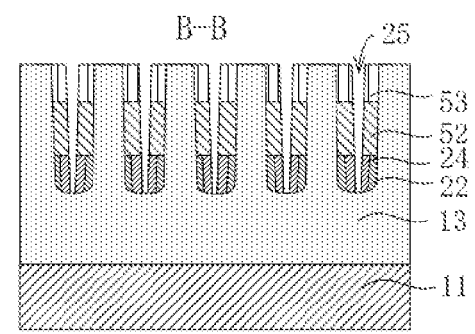
Figure 53:
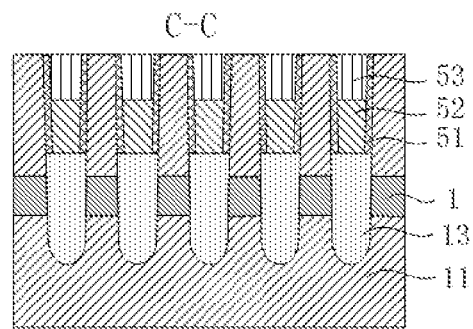
Figure 54:
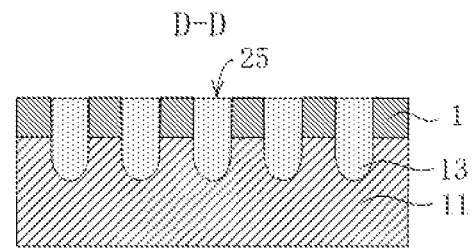
Figure 55:
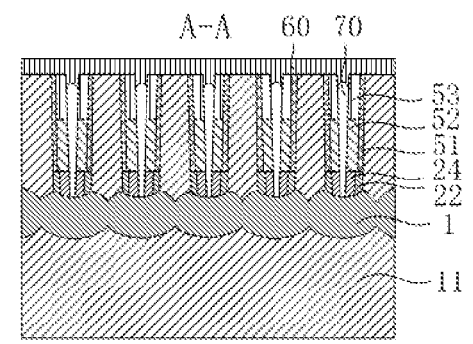
FIGS. 55 to 58 are schematic diagrams of cross sections respectively taken along A-A, B-B, C-C, and D-D after a cap layer is formed according to an embodiment of the present disclosure.
Figure 56:
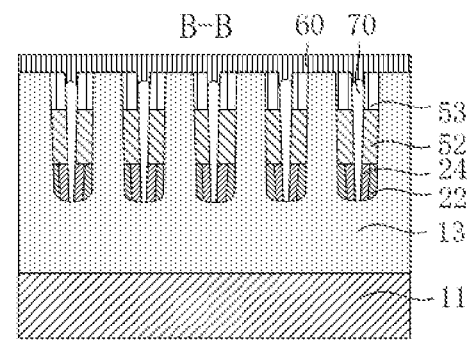
Figure 57:
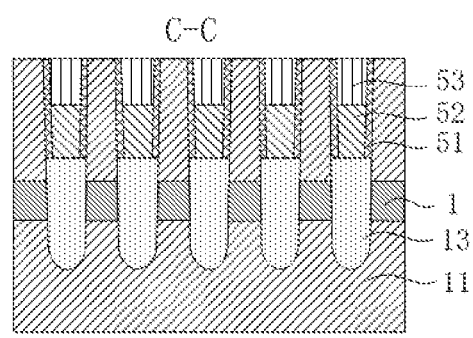
Figure 58:
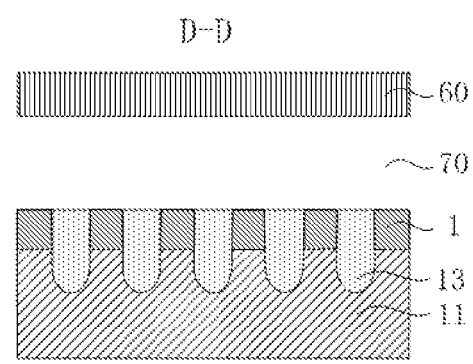

With reference to FIGS. 23 to 30, the second insulating layer 24 covers the sidewall of the second trench 23. The second insulating layer 24 defines a third trench 25. A space occupied by the second insulating layer 24 and the first insulating layer 22 is used for forming WLs 2 subsequently. The sum of the thicknesses of the first insulating layer 22 and the second insulating layer 24 is equal to the target value, which may be 5 to 20 nm. Through such a disposal, increasing the target value, one the one hand, can make the WL have a larger manufacturing space for formation, and on the other hand make the third trench 25 narrower for the subsequent formation of an air gap 70 (with reference to FIG. 47).

As shown in FIGS. 27 to 30, the first insulating layer 22 may be thinner than the second insulating layer 24, that is, a relatively thin first insulating layer 22 is formed on the sidewall of the first trench 21, and then a relatively thick second insulating layer 24 is formed on the sidewall of the first insulating layer 22. The second insulating layer 24 may be made of an oxide, such as silicon oxide. Preferably, the second insulating layer 24 and the first insulating layer 22 are made of a same material. In this way, on the one hand, the second insulating layer 24 and the first insulating layer 22 can be integrated, to avoid layer separation; one the other hand, the second insulating layer 24 and the first insulating layer 22 can be removed at the same time, which is beneficial for the subsequent production.

In some possible embodiments, the forming of the second insulating layer 24 on the sidewall of the second trench 23, where the second insulating layer 24 located in the second trench 23 defines the third trench 25, and the sum of thicknesses of the first insulating layer 22 and the second insulating layer 24 is equal to the target value includes:
  depositing an initial second insulating layer on the sidewall and a bottom wall of the second trench 23, the base 10, and the first insulating layer 22. The initial second insulating layer covers the sidewall and a bottom wall of the second trench 23, the base 10, and the first insulating layer 22. In an embodiment in which the base 10 includes the protective layer 14, the initial second insulating layer covers the protective layer 14.

The initial second insulating layer is etched. The initial second insulating layer located on the sidewall of the second trench 23 is retained. The retained initial second insulating layer forms the second insulating layer 24. After the deposition, the initial second insulating layer 24 is etched back. The initial second insulating layer on a bottom wall of the first trench 23, the first insulating layer 22, and the base 10 is removed. The initial second insulating layer 24 on the sidewall of the second trench 23 is retained, to form the second insulating layer 24. As shown in FIGS. 19 to 30, the first insulating layer 22 and the second insulating layer 24 are formed sequentially on the sidewall of the first trench 21.

Step S50: Form an isolation layer in the third trench, where the isolation layer fills up the third trench.

With reference to FIGS. 27 to 34, an isolation layer 30 is deposited in the third trench 25, and fills up the third trench 25. The isolation layer 30 is configured to isolate the WLs 2, to ensure that adjacent WLs 2 are insulated from each other. The second insulating layer 24 has a high selectivity ratio compared to the isolation layer 30, to reduce damages on the isolation layer 30 when the second insulating layer 24 is etched. When the second insulating layer 24 is made of an oxide, the material of the isolation layer 30 may be silicon nitride or silicon oxynitride, which is relatively hard. In some possible embodiments, after the isolation layer 30 is formed in the third trench 25, where the isolation layer 30 fills up the third trench 25, the method further includes: flattening the base 10 and the isolation layer 30. Through such a disposal, the base body 10 and the isolation layer 30 form a relatively flat top surface. In the embodiment in which the base 10 includes the protective layer 14, the flattening on the base 10 and the isolation layer 30 includes removing the protective layer 14 and the isolation layer 30 on the substrate 11, to expose the substrate 11, and electrically connect the substrate 11 to another structure.

Above all, in the manufacturing method of a semiconductor structure provided by embodiments of the present disclosure, the base 10 is provided with the first trenches 21 extending along a first direction. The first insulating layer 22 is formed on a sidewall of the first trench 21. The first insulating layer 22 defines the second trench 23 and the thickness of the first insulating layer 22 is smaller than the target value. Because the first insulating layer is relatively thin, a relatively large part of the substrate 11 is exposed in the second trench 23. The substrate 11 exposed in the second trench 23 is silicified, to make the silicified substrate 11 integrated along the second direction, thereby improving the performance of the semiconductor structure. In addition, the second insulating layer 24 is formed on the sidewall of the second trench 23. WLs 2 are formed subsequently in a region where the first insulating layer 22 and the second insulating layer 24 are located. A sum of thicknesses of the first insulating layer 22 and the second insulating layer 24 is equal to the target value, to have a sufficient space for manufacturing the WLs 2, and further improve the performance of the semiconductor structure.

Based on the foregoing embodiments, in some possible implementations, after the depositing of the third insulating layer 13 in each of the fourth trenches 14, where the third insulating layer 13 fills the fourth trench 12, the method further includes: depositing a protective layer 14 on the substrate 11, where the protective layer 14 covers the substrate 11 and the third insulating layer 13. The protective layer 14 isolates and protects the substrate 11, to prevent the top surface of the substrate 11 from being exposed, thereby preventing it from generating a silicification reaction.

Based on the foregoing embodiments, in some other possible implementations, before or after the depositing of the third insulating layer 13 in each of the fourth trenches 14, where the third insulating layer 12 fills the fourth trench 12, the method further includes: doping the substrate 11 between adjacent fourth trenches 12, to form a source region, a drain region, and a channel region located between the source region and the drain region. The doping may be implemented through an ion plantation process, a thermal diffusion process, or the like. The source region and the drain region may be doped with a same type (N type or P type) of material. The channel region and the source region/drain region are doped with different materials.

With reference to FIGS. 35 to 50, in some possible embodiments, after the forming of the isolation layer 30 in the third trench 25, where the isolation layer 30 fills up the third trench 25 (step S50), the method further includes:
  step S60: Partially remove the first insulating layer, the second insulating layer, and the third insulating layer to form a filling space, where the filling space exposes the substrate.

As shown in FIGS. 35 to 38, the first insulating layer 22, the second insulating layer 24, and the third insulating layer 13 are etched to form a filling space 40. The depth of the is filling space 40 is shown as H in FIG. 37, and is smaller than that of the first trench 21, to prevent the BL 1 from being exposed, thereby ensuring that the BL 1 and the WL 2 formed in the filling space 40 are insulated from each other.

Preferably, the first insulating layer 22, the second insulating layer 24, and the third insulating layer 13 are made of a same material, such that the three insulating layers can be removed at the same time, to simplify the manufacturing steps of the semiconductor structure. After the plurality of filling spaces 40 are formed, they are isolated through the isolation layers 30. The substrate 11 exposed in each of the filling spaces 40 is of a columnar structure.

In some possible implementations, the removing of a part of the first insulating layer 22, a part of the second insulating layer 24, and a part of the third insulating layer 13 to form the filling space 40, where the filling space 40 exposes the substrate 11 includes:

etching the first insulating layer 22, the second insulating layer 24, and the third insulating layer 13 to an initial depth in a self-aligned manner, to form an initial filling space 40. The self-aligned etching refers to that the first insulating layer 22, the second insulating layer 24, and the third insulating layer 13 can be etched directly by a selectivity of the three insulating layers to the substrate 11, without a mask, thereby simplifying the manufacturing process of the semiconductor structure. After the initial filling space is formed, a depth of the initial filling space is an initial depth, that is, a distance between a bottom surface of the initial filling space and the top surface of the substrate 11 is the initial depth.

A support layer is formed on surfaces of the substrate 11 and the isolation layer 30 that are exposed in the initial filling space, and fills up the initial filling space between the substrate 11 and the isolation layer 30. Through such a disposal, the support layer can support the isolation layer 30, to prevent the isolation layer 30 from collapsing due to an increase in the depth of the filling space 40. The support layer and the first support layer may be made of a same material, such as silicon nitride, such that the support layer is integrated with the isolation layer 30. The support layer fills up the initial filling space between the substrate 11 and the isolation layer 30. A gap is formed between adjacent columnar structures in the substrate 11. This part of the initial filling space is remained, such that the first insulating layer 22, the second insulating layer 24, and the third insulating layer 13 are continuously etched.

The first insulating layer 22, the second insulating layer 24, and the third insulating layer 13 are etched to a preset depth by the remaining initial filling space, to form the filling space 40, where the filling space 40 includes the remaining initial filling space. For example, an etching gas is fed into or an etching solution is poured into the remaining initial filling space, to etch the first insulating layer 22, the second insulating layer 24, and the third insulating layer 13 to the preset depth. The remaining initial filling space and the newly formed space form the filling space 40.

Step S70: Form, in the filling space, a gate dielectric layer covering at least a part of the substrate, a conductive layer filling a space between the gate dielectric layers as well as a space between the gate dielectric layer and the isolation layer, and a fourth insulating layer covering the conductive layer.

With reference to FIGS. 39 to 50, the gate dielectric layer is formed on the substrate 11 in the filling space 40, and surrounds and covers the peripheral surface of the substrate 11. The conductive layer 52 fills a region defined by the gate dielectric layer and the isolation layer 30, and is configured to be the WLs 2. The fourth insulating layer 53 covers the conductive layer 52 and the gate dielectric layer, and fills up the filling space 40.

The gate dielectric layer may be made of an oxide, such as silicon oxide, silicon oxynitride, tantalum oxide, aluminum oxide, hafnium oxide. The thickness of the gate dielectric layer may be determined according to a specific need. The conductive layer 52 may be made of metal such as tantalum, tungsten, tantalum nitride or titanium nitride, or another conductive material such as polysilicon. The fourth insulating layer 53 may be made of an oxide, such as silicon oxide.

In some possible embodiments, the gate dielectric layer covers the entire surface of the substrate 11 exposed in each of the filling spaces 40. In other words, the gate dielectric layer covers the entire peripheral surface of the substrate 11 in each of the filling spaces 40. In some possible embodiments, the gate dielectric layer covers a peripheral surface of the channel region in the substrate 11 exposed in each of the filling spaces 40. Specifically, with reference to FIGS. 39 to 50, the forming, in the filling space 40, of the is gate dielectric layer covering at least a part of the substrate 11, the conductive layer 52 filling a space between the gate dielectric layers as well as a space between the gate dielectric layer and the isolation layer 30, and the fourth insulating layer 53 covering the conductive layer 52 may include: forming an initial dielectric layer 51 on an exposed surface of the substrate 11, and taking the initial dielectric layer 51 located in a lower part of the filling space 40 as the gate dielectric layer, where gaps are formed between the gate dielectric layers. As shown in FIGS. 39 to 42, the substrate 11 is of a columnar structure. The top surface and the side surface of the columnar structure are exposed, and the initial dielectric layer 51 is formed thereon. The initial dielectric layer 51 located in a lower part of the filling space 40 forms the gate dielectric layer. The gate dielectric layer is opposite to at least a part of the channel region of the columnar structure. The gate dielectric layers are arranged at intervals.

In some possible implementations, the initial dielectric layer 51 is formed on the exposed surface of the substrate 11 through a thermal oxidation process. Specifically, the substrate 11 and a gas containing an oxidizing substance undergo a chemical reaction at a high temperature to form a dense oxide film on the surface of the substrate 11, and the oxide film is the initial dielectric layer 51. thermal oxidation process can meet a requirement for miniaturing the size of the semiconductor structure. The size of the columnar structure can be miniatured below 5 nm. In some other possible implementations, the initial dielectric layer 51 is formed on the surface of the substrate 11 exposed through a deposition process.

After the initial dielectric layer 51 is formed, the conductive layer 52 is deposited in the filling space 40, where the conductive layer 52 fills a space between the gate dielectric layers as well as a space between the gate dielectric layer and the isolation layer 30. As shown in FIGS. 43 to 46, the conductive layer 52 is continuously deposited in the filling space 40 in which the gate dielectric layer is formed. The conductive layer 52 is opposite to the gate dielectric layer.

After the conductive layer 52 is formed, the fourth insulating layer 53 is deposited in the remaining filling space 40. As shown in FIGS. 47 to 50, the fourth insulating layer 53 is formed through a deposition process. The fourth insulating layer 53 fills up the filling space 40. Specifically, the fourth insulating layer 53 is deposited in the remaining filling space 40 and on the substrate 11. The fourth insulating layer 53 on the substrate 11 is removed through a flattening process, to expose the substrate 11.

In this embodiment, the source region, the drain region, and the channel region are formed in the columnar structure. The columnar structure, the gate dielectric layer, and the conductive layer 52 form a vertical gate-all-around (VGAA) transistor. Under the same area on the substrate 11, the channel region can be lengthened by heightening the columnar structure, thereby improving the short-channel effect of the transistor and the performance of the semiconductor structure.

With reference to FIGS. 51 to 58, in some possible embodiments of the present disclosure, after the forming, in the filling space 40, of the gate dielectric layer covering at least a part of the substrate 11, the conductive layer 52 filling a space between the gate dielectric layers as well as a space between the gate dielectric layer and the isolation layer 30, and the fourth insulating layer 53 covering the conductive layer 52 (step S70), the method further includes:

removing the isolation layer 30, to expose the third trench 25. As shown in FIGS. 51 to 54, the isolation layer 30 is removed through a dry or wet etching process, to expose the third trench 25. In some possible examples, the isolation layer 30 is completely removed, such that the third trench 25 is completely exposed. In some other possible examples, the isolation layer 30 is removed by a preset depth, to partially expose the third trench 25. In this case, the conductive layer 52 is exposed in the third trench 25.

An opening of the third trench 25 is sealed, to form an air gap 70 in the third trench 25. As shown in FIGS. 55 to 58, the air gap 70 is at least formed between adjacent conductive layers 52. Using the characteristic that the dielectric constant of air is approximately 1 can decrease the parasitic resistance between adjacent conductive layers 52, to improve performance of the semiconductor structure. Specifically, the sealing of the opening of the third trench 25, to form the air gap 70 in the third trench 25 includes: depositing a cap layer 60 on the base 10, where the cap layer 60 seals off the opening of the third trench 25, to form the air gap 70. For example, the cap layer 60 is formed by depositing a material (for example, a nitride) with a poor filling ability. The material is formed at the opening of the third trench 25, and is not deposited or not completely deposited into the third trench 25, such that the air gap 70 is formed in the third trench 25. Alternatively, the opening of the third trench 25 is sealed by controlling the parameters of the deposition process, such as a deposition rate.

Finally, it should be noted that the foregoing embodiments are used only to explain the technical solutions of the present disclosure, but are not intended to limit the present disclosure. Although the present disclosure is described in detail with reference to the foregoing embodiments, those of ordinary skill in the art should understand that they can still modify the technical solutions described in the foregoing embodiments, or make equivalent substitutions on some or all technical features therein. The modifications or substitutions do not make the essence of the corresponding technical solutions deviate from the scope of the technical solutions of the embodiments of the present disclosure.

The invention claimed is:

1. A manufacturing method of a semiconductor structure, comprising:
   forming a plurality of first trenches arranged at intervals and extending along a first direction in a base;
   forming a first insulating layer on a sidewall of the first trench, wherein a thickness of the first insulating layer is smaller than a target value, and the first insulating layer located in the first trench defines a second trench;
   performing a silicification reaction on a substrate exposed in the second trench to form a plurality of bit lines;
   forming a second insulating layer on a sidewall of the second trench, wherein the second insulating layer located in the second trench defines a third trench, and a sum of thicknesses of the first insulating layer and the second insulating layer is equal to the target value; and
   forming an isolation layer in the third trench, wherein the isolation layer fills up the third trench;
   wherein before the forming a plurality of first trenches arranged at intervals and extending along a first direction in a base, the manufacturing method further comprises:
   providing the base, wherein the base comprises the substrate and a third insulating layer, the substrate is provided with a plurality of fourth trenches arranged at intervals and extending along a second direction, and the third insulating layer fills the fourth trench; and
   wherein the plurality of bit lines are extending along the second direction and isolated by the third insulating layer.

2. The manufacturing method according to claim 1, wherein the forming a first insulating layer on a sidewall of the first trench, wherein a thickness of the first insulating layer is smaller than a target value, and the first insulating layer located in the first trench defines a second trench comprises:
   depositing an initial first insulating layer on the sidewall and a bottom wall of the first trench, and the base; and
   etching the initial first insulating layer to retain the initial first insulating layer located on the sidewall of the first trench, and taking the retained initial first insulating layer as the first insulating layer.

3. The manufacturing method according to claim 1, wherein the forming a second insulating layer on a sidewall of the second trench, wherein the second insulating layer located in the second trench defines a third trench, and a sum of thicknesses of the first insulating layer and the second insulating layer is equal to the target value comprises:
   depositing an initial second insulating layer on the sidewall and a bottom wall of the second trench, the base, and the first insulating layer; and
   etching the initial second insulating layer to retain the initial second insulating layer located on the sidewall of the second trench, and taking the retained initial second insulating layer as the second insulating layer.

4. The manufacturing method according to claim 1, wherein the thickness of the first insulating layer is smaller than that of the second insulating layer, and the target value is 5 to 20 nm.

5. The manufacturing method according to claim 1, after the forming an isolation layer in the third trench, wherein the isolation layer fills up the third trench, the manufacturing method further comprises:
   flattening the base and the isolation layer.

6. The manufacturing method according to claim 1, wherein the providing the base, wherein the base comprises the substrate and a third insulating layer, the substrate is provided with a plurality of fourth trenches arranged at intervals and extending along a second direction, and the third insulating layer fills the fourth trench comprises:
   providing the substrate;
   etching the substrate, to form the plurality of fourth trenches in the substrate, wherein the fourth trench is deeper than the first trench; and depositing the third insulating layer in each of the fourth trenches, wherein the third insulating layer fills up the fourth trench.

7. The manufacturing method according to claim 6, after the depositing the third insulating layer in each of the fourth trenches, wherein the third insulating layer fills up the fourth trench, the manufacturing method further comprises:

depositing a protective layer on the substrate, wherein the protective layer covers the substrate and the third insulating layer.

8. A manufacturing method of a semiconductor structure, comprising:

forming a plurality of first trenches arranged at intervals and extending along a first direction in a base;

forming a first insulating layer on a sidewall of the first trench, wherein a thickness of the first insulating layer is smaller than a target value, and the first insulating layer located in the first trench defines a second trench;

performing a silicification reaction on a substrate exposed in the second trench;

forming a second insulating layer on a sidewall of the second trench, wherein the second insulating layer located in the second trench defines a third trench, and a sum of thicknesses of the first insulating layer and the second insulating layer is equal to the target value; and forming an isolation layer in the third trench, wherein the isolation layer fills up the third trench;

wherein before the forming a plurality of first trenches arranged at intervals and extending along a first direction in a base, the manufacturing method further comprises:

providing the base, wherein the base comprises the substrate and a third insulating layer, the substrate is provided with a plurality of fourth trenches arranged at intervals and extending along a second direction, and the third insulating layer fills the fourth trench; and wherein after the forming an isolation layer in the third trench, wherein the isolation layer fills up the third trench, the manufacturing method further comprise:

partially removing the first insulating layer, the second insulating layer, and the third insulating layer to form a filling space, wherein the filling space exposes the substrate; and forming, in the filling space, a gate dielectric layer covering at least a part of the substrate, a conductive layer filling a space between the gate dielectric layers as well as a space between the gate dielectric layer and the isolation layer, and a fourth insulating layer covering the conductive layer.

9. The manufacturing method according to claim 8, wherein the forming, in the filling space, a gate dielectric layer covering at least a part of the substrate, a conductive layer filling a space between the gate dielectric layers as well as a space between the gate dielectric layer and the isolation layer, and a fourth insulating layer covering the conductive layer comprises:

forming an initial dielectric layer on an exposed surface of the substrate, and taking the initial dielectric layer located in a lower part of the filling space as the gate dielectric layer, wherein gaps are formed between the gate dielectric layers;

depositing the conductive layer in the filling space, wherein the conductive layer fills a space between the gate dielectric layers as well as a space between the gate dielectric layer and the isolation layer; and depositing the fourth insulating layer in the remaining filling space.

10. The manufacturing method according to claim 9, wherein the forming an initial dielectric layer on an exposed surface of the substrate, and taking the initial dielectric layer located in a lower part of the filling space as the gate dielectric layer, wherein gaps are formed between the gate dielectric layers comprises:

forming the initial dielectric layer on the exposed surface of the substrate through a thermal oxidation process.

11. The manufacturing method according to claim 8, after the forming, in the filling space, a gate dielectric layer covering at least a part of the substrate, a conductive layer filling a space between the gate dielectric layers as well as a space between the gate dielectric layer and the isolation layer, and a fourth insulating layer covering the conductive layer, the manufacturing method further comprises:

removing the isolation layer, to expose the third trench; and sealing an opening of the third trench, to form an air gap in the third trench.

12. The manufacturing method according to claim 11, wherein the sealing an opening of the third trench, to form an air gap in the third trench comprises:

depositing a cap layer on the base, wherein the cap layer seals off the opening of the third trench, to form the air gap.

13. The manufacturing method according to claim 8, wherein the partially removing the first insulating layer, the second insulating layer, and the third insulating layer to form a filling space, wherein the filling space exposes the substrate comprises:

etching the first insulating layer, the second insulating layer, and the third insulating layer to an initial depth in a self-aligned manner, to form an initial filling space;

forming a support layer on surfaces of the substrate and the isolation layer that are exposed in the initial filling space, wherein the support layer fills up the initial filling space between the substrate and the isolation layer;

etching the first insulating layer, the second insulating layer, and the third insulating layer to a preset depth by the remaining initial filling space, to form the filling space, wherein the filling space comprises the remaining initial filling space.

14. A semiconductor structure, formed by the manufacturing method according to claim 1.

15. The manufacturing method according to claim 1, after the forming an isolation layer in the third trench, wherein the isolation layer fills up the third trench, the manufacturing method further comprise:

partially removing the first insulating layer, the second insulating layer, and the third insulating layer to form a filling space, wherein the filling space exposes the substrate; and forming, in the filling space, a gate dielectric layer covering at least a part of the substrate, a conductive layer filling a space between the gate dielectric layers as well as a space between the gate dielectric layer and the isolation layer, and a fourth insulating layer covering the conductive layer.

16. The manufacturing method according to claim 15, wherein the forming, in the filling space, a gate dielectric layer covering at least a part of the substrate, a conductive layer filling a space between the gate dielectric layers as well as a space between the gate dielectric layer and the isolation layer, and a fourth insulating layer covering the conductive layer comprises:

forming an initial dielectric layer on an exposed surface of the substrate, and taking the initial dielectric layer located in a lower part of the filling space as the gate dielectric layer, wherein gaps are formed between the gate dielectric layers;

depositing the conductive layer in the filling space, wherein the conductive layer fills a space between the gate dielectric layers as well as a space between the gate dielectric layer and the isolation layer; and depositing the fourth insulating layer in the remaining filling space.

17. The manufacturing method according to claim 16, wherein the forming an initial dielectric layer on an exposed surface of the substrate, and taking the initial dielectric layer located in a lower part of the filling space as the gate dielectric layer, wherein gaps are formed between the gate dielectric layers comprises:

forming the initial dielectric layer on the exposed surface of the substrate through a thermal oxidation process.

18. The manufacturing method according to claim 15, after the forming, in the filling space, a gate dielectric layer covering at least a part of the substrate, a conductive layer filling a space between the gate dielectric layers as well as a space between the gate dielectric layer and the isolation layer, and a fourth insulating layer covering the conductive layer, the manufacturing method further comprises:

removing the isolation layer, to expose the third trench; and sealing an opening of the third trench, to form an air gap in the third trench.

19. The manufacturing method according to claim 18, wherein the sealing an opening of the third trench, to form an air gap in the third trench comprises:

depositing a cap layer on the base, wherein the cap layer seals off the opening of the third trench, to form the air gap.

20. The manufacturing method according to claim 15, wherein the partially removing the first insulating layer, the second insulating layer, and the third insulating layer to form a filling space, wherein the filling space exposes the substrate comprises:

etching the first insulating layer, the second insulating layer, and the third insulating layer to an initial depth in a self-aligned manner, to form an initial filling space;

forming a support layer on surfaces of the substrate and the isolation layer that are exposed in the initial filling space, wherein the support layer fills up the initial filling space between the substrate and the isolation layer;

etching the first insulating layer, the second insulating layer, and the third insulating layer to a preset depth by the remaining initial filling space, to form the filling space, wherein the filling space comprises the remaining initial filling space.

* * * * *